United States Patent
Kalantzis et al.

(10) Patent No.: US 11,790,033 B2
(45) Date of Patent: Oct. 17, 2023

(54) ACCELERATED QUASI-NEWTON METHODS ON ANALOG CROSSBAR HARDWARE

(71) Applicants: INTERNATIONAL BUSINESS MACHINES CORPORATION, Armonk, NY (US); RAMOT AT TEL-AVIV UNIVERSITY LTD., Tel Aviv (IL)

(72) Inventors: Vasileios Kalantzis, White Plains, NY (US); Shashanka Ubaru, Ossining, NY (US); Lior Horesh, North Salem, NY (US); Haim Avron, Tel Aviv (IL); Oguzhan Murat Onen, Boston, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 604 days.

(21) Appl. No.: 17/023,318

(22) Filed: Sep. 16, 2020

(65) Prior Publication Data

US 2022/0083623 A1 Mar. 17, 2022

(51) Int. Cl.
*G06F 17/12* (2006.01)
*G06F 9/48* (2006.01)
(Continued)

(52) U.S. Cl.
CPC ............ *G06F 17/12* (2013.01); *G06F 9/4881* (2013.01); *G06F 17/16* (2013.01); *G06N 3/04* (2013.01); *G06N 3/08* (2013.01)

(58) Field of Classification Search
CPC ........ G06F 17/12; G06F 9/4881; G06F 17/16; G06F 7/5443; G06N 3/04; G06N 3/08
(Continued)

(56) References Cited

U.S. PATENT DOCUMENTS 8,688,616 B2   4/2014   Martinez
8,768,659 B2   7/2014   Vasudevan et al.
(Continued)

FOREIGN PATENT DOCUMENTS

CN    103135094 B    12/2014
CN    110619363 A    12/2019
(Continued)

OTHER PUBLICATIONS

Broyden, C.G., "Quasi-Newton Methods and their Application to Function Minimisation"; AMS (1966); pp. 368-381.
(Continued)

*Primary Examiner* — Tan V Mai
(74) *Attorney, Agent, or Firm* — Intelletek Law Group, PLLC; Gabriel Daniel, Esq.

(57) ABSTRACT

A computer implemented method for speeding up execution of a convex optimization operation one or more quadratic complexity operations to be performed by an analog crossbar hardware switch, and identifying one or more linear complexity operations to be performed by a CPU. At least one of the quadratic complexity operations is performed by the analog crossbar hardware, and at least one of the linear complexity operations is performed by the CPU. An iteration of an approximation of a solution to the convex optimization operation is updated by the CPU.

20 Claims, 10 Drawing Sheets

(51) Int. Cl.
*G06F 17/16* (2006.01)
*G06N 3/04* (2023.01)
*G06N 3/08* (2023.01)

(58) Field of Classification Search
CPC ........ G06N 3/065; G06N 3/084; G11C 11/54; G11C 13/0002
USPC .......................................................... 708/801
See application file for complete search history.

(56) References Cited

U.S. PATENT DOCUMENTS

| | | | |
|---|---|---|---|
| 8,892,487 B2 * | 11/2014 | Chang | G06N 3/065 706/27 |
| 9,601,109 B2 | 3/2017 | Horesh et al. | |
| 9,892,539 B2 | 2/2018 | Thomaszewski et al. | |
| 10,055,434 B2 | 8/2018 | Birdwell et al. | |
| 10,409,233 B2 | 9/2019 | Quirynen et al. | |
| 10,437,658 B2 | 10/2019 | Alonso et al. | |
| 10,467,325 B2 | 11/2019 | Rosman et al. | |
| 2014/0310220 A1 * | 10/2014 | Chang | G06N 3/08 706/25 |
| 2019/0050719 A1 | 2/2019 | Cantin et al. | |
| 2019/0205741 A1 | 7/2019 | Gupta et al. | |
| 2020/0034713 A1 | 1/2020 | Golovashkin et al. | |

FOREIGN PATENT DOCUMENTS

| | | |
|---|---|---|
| TW | I364093 B | 5/2012 |
| WO | 2019/216150 A1 | 11/2019 |

OTHER PUBLICATIONS

Chapelle, O. et al., "Improved Preconditioner for Hessian Free Optimization"; NIPS Workshop on Deep Learning and Unsupervised Feature Learning (2011) 8 pgs.
Fei, Y. et al., "Parallel L-BFGS-B Algorithm on GPU"; Computers & Graphics (2014); vol. 40; 9 pgs.
Haensch, W. et al., "The Next Generation of Deep Learning Hardware: Analog Computing"; Proceedings of the IEEE (2019); vol. 107:1: pp. 108-122.
Horesh L. et al., "Large-Scale Non-Linear 3D Reconstruction Algorithms for Electrical Impedance Tomography of the Human Head"; Research Gate (2007); 5 pgs.
Liu, D. C. et al., "On the Limited Memory BFGS Method for Large Scale Optimization"; Mathematical Programming (1989); vol. 45; pp. 503-528.
Martens, J., "Deep Learning via Hessian-free Optimization"; University of Toronto (2010); 74 pgs.
Pearlmutter, B. A., "Fast Exact Multiplication by the Hessian"; Siemens Corporate Research, Princeton, NJ (1993); 13 pgs.
Rasch, M. J. et al., "Training Large-Scale ANNs on Simulated Resistive Crossbar Arrays"; Arxiv:1906.02698v1 (2019); 15 pgs.
Schraudolph, N. N., "Fast Curvature Matrix-Vector Products for Second-Order Gradient Descent"; Letter (2002); pp. 1723-1738.
Sohl-Dickstein, J. et al., "Fast Large-Scale Optimization By Unifying Stochastic Gradient And Quasi-Newton Methods"; Proceedings of the 31st International Conference on Machine Learning (2014); 9 pgs.
Byrd, R.H., et al., "A Stochastic Quasi-Newton Method for Large-Scale Optimization"; arXiv:1401.7020v2 [math.OC] (2015); 31 pgs.
Conforti, D. et al., "A Parallel Implementation Of Automatic Differentiation For Partially Separable Functions Using PVM"; Parallel Computing (1996); vol. 22; pp. 643-656.

* cited by examiner

ACCELERATED QUASI-NEWTON METHODS ON ANALOG CROSSBAR HARDWARE

BACKGROUND

Technical Field

The present disclosure generally relates to methods for reducing computational bottlenecks in convex optimization, and more particularly, to the application of analog crossbar hardware in convex optimization algorithms.

Description of the Related Art

In general, the computational complexity to execute algorithms in various fields continues to increase. For example, convex optimization algorithms are being used in many fields that include, but are not limited to, Artificial Intelligence (AI), Deep Neural Networks, Robotics, Digital Signal Processing, Network Analysis, and many forms of scientific computing. In convex optimization, the goal is to solve an unconstrained minimization problem:

$$\min_{x \in \mathbb{R}^n} f(x)$$

Where f is convex and at least twice differentiable.

There has been a focus on utilizing Quasi-Newton algorithms for solving unconstrained minimization problems. Quasi-Newton algorithms are used to find zeroes and local/global minima and maxima of functions when the construction of the full Hessian matrix is too expensive to compute at every iteration. For example, forming the exact Hessian matrix at each iteration introduces a quadratic memory and computational cost when convex optimization functions are performed.

There are increased efforts to use memristor analog crossbar hardware in the context of unconstrained optimization. For example, an analog crossbar array can be used in which individual crossbars are designated to execute respective portions of a computation. A set of crosspoint devices constructed of analog crossbars can provide a matrix mapped into a physical array. Nanowire sets may be used in which one set of nanowires is configured to be an input, and another set to output a value of the function. However, the application analog crossbar arrays also have drawbacks in terms of computational costs, power usage, etc.

SUMMARY

According to various embodiments, a computer implemented method for speeding up execution of a convex optimization operation by identifying one or more quadratic complexity operations to be performed by an analog crossbar hardware switch, and identifying one or more linear complexity operations to be performed by a CPU. At least one of the quadratic complexity operations is performed by the analog crossbar hardware, and at least one of the linear complexity operations is performed by the CPU. At each iteration, the current approximation of the minimizer is updated by the CPU. This method speeds up the solving of an unconstrained minimization problem.

In an embodiment, the CPU is configured to compute a difference between the two most recent gradients of the approximation of the solution to the convex optimization operation.

In an embodiment, the performing of at least one of the quadratic complexity operation includes mapping an initial approximation of a Hessian matrix or an inverse Hessian matrix to the analog crossbar hardware switch.

In an embodiment, there is an updating of the initial approximation of the Hessian matrix or the inverse Hessian matrix in the analog crossbar hardware switch.

In an embodiment, the convex optimization operation is a member of the Quasi-Newton family of algorithms, and the method further includes configuring a plurality of analog crossbars of the analog crossbar hardware switch into a matrix to perform one or more quadratic complexity operations of the Quasi-Newton algorithm.

In an embodiment, performing at least one quadratic complexity operation includes obtaining a search direction by performing a matrix-vector product in the analog crossbar hardware switch.

According to another embodiment, a convex optimization device includes an analog crossbar hardware unit including a plurality of memristor elements configured in a matrix to perform one or more quadratic complexity operations. A CPU is configured to perform one or more linear complexity operations. A memory is configured to store an input and receive an output from the analog crossbar hardware unit, and to store an output of the linear complexity operation executed by the CPU.

In an embodiment, an identifier module is configured to identify one or more quadratic complexity operations to be performed by the analog crossbar hardware unit, and to identify the one or more linear complexity operations to be performed by the CPU.

In an embodiment, the plurality of memristor elements are resistor processing unit (RPU) switches.

In an embodiment, the matrix of the plurality of memristor elements of the analog crossbar hardware is configured to one of a Hessian matrix or an inverse Hessian matrix to perform quadratic complexity operations of a Quasi-Newton algorithm. The CPU is configured to perform linear complexity operations of the Quasi-Newton algorithm.

In an embodiment, an initial approximation of one of the Hessian matrix or the inverse Hessian matrix is mapped to the analog crossbar hardware unit.

According to another embodiment, the accelerated Quasi-Newton method of convex optimization includes configuring a plurality of memristor elements of an analog crossbar hardware unit in a matrix to perform one or more quadratic complexity operations of an algorithm. One or more linear complexity operations of the algorithm are executed by a CPU configured. An input and an output of data from the analog crossbar hardware unit, and an output of the linear complexity operation executed by the CPU are stored in a memory.

In an embodiment, one of an initial Hessian matrix or an initial inverse Hessian matrix is mapped to the analog hardware crossbar unit.

In an embodiment, an initial approximation of the Hessian matrix or an initial approximation of the inverse Hessian matrix in the analog crossbar hardware unit is updated.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

The method and device according to the present disclosure provides an improvement in computer operation, and an improvement in solving convex optimizations problems. The improvement includes the application of analog crossbar hardware to some of the operations, such as to quadratic complexity (e.g., $n^2$) operations, and a CPU to execute linear complexity operations. As the inputs to a matrix can number into the thousands depending on the problem, the application of only digital hardware (e.g., CPU) is too costly, and not efficient. However, by applying analog crossbar hardware to performing certain operations, and a CPU executing other operations, an improvement is realized that is heretofore unknown. Optimization problems (convex or not) have many practical applications in a variety of fields, including but in no way limited to, deep neural networks, robotics, digital signal processing, network analysis, and scientific computing. The faster processing speed provides an increased efficiency in operation which results to savings in time and power.

Example Architecture

Figure 1A:
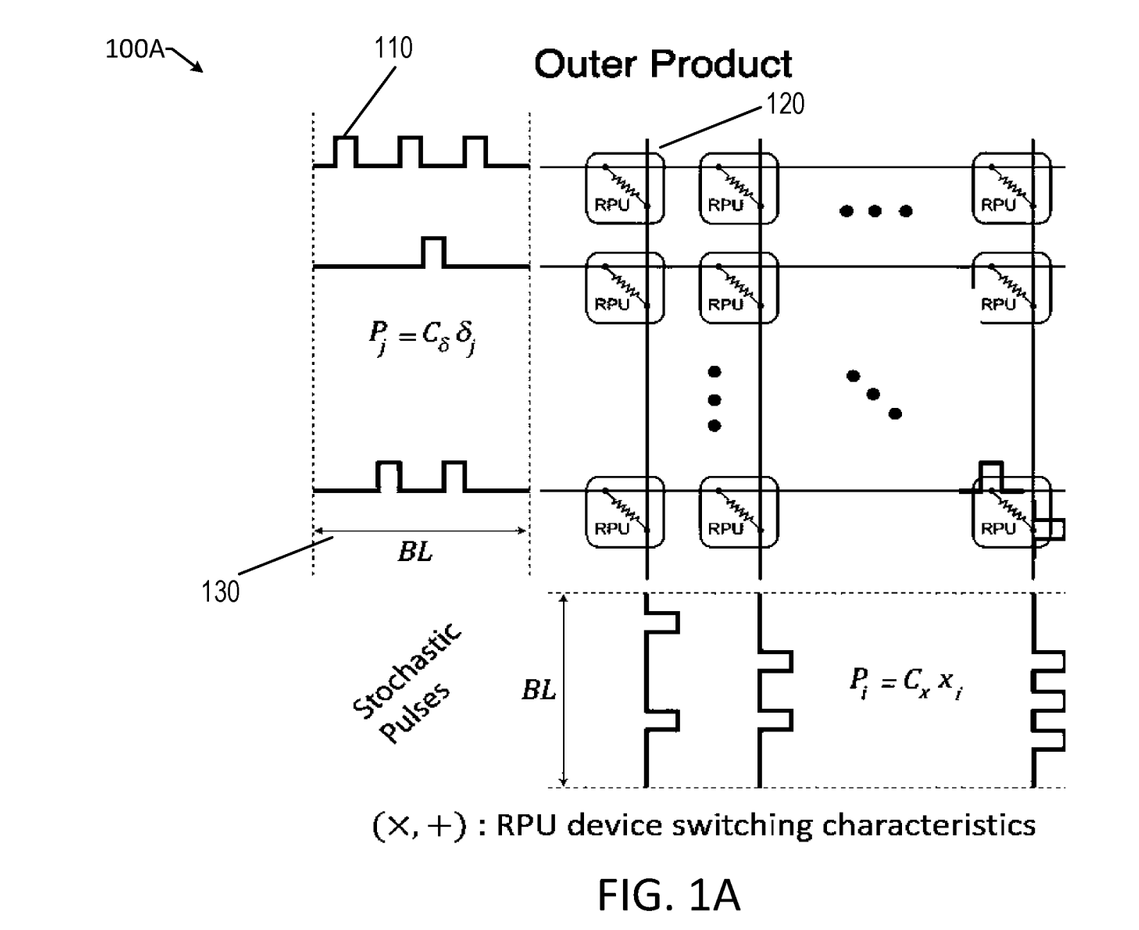
FIGS. 1A and 1B illustrate an outer product and a matrix product of an analog crossbar hardware unit, respectively, consistent with an illustrative embodiment.
Figure 1B:
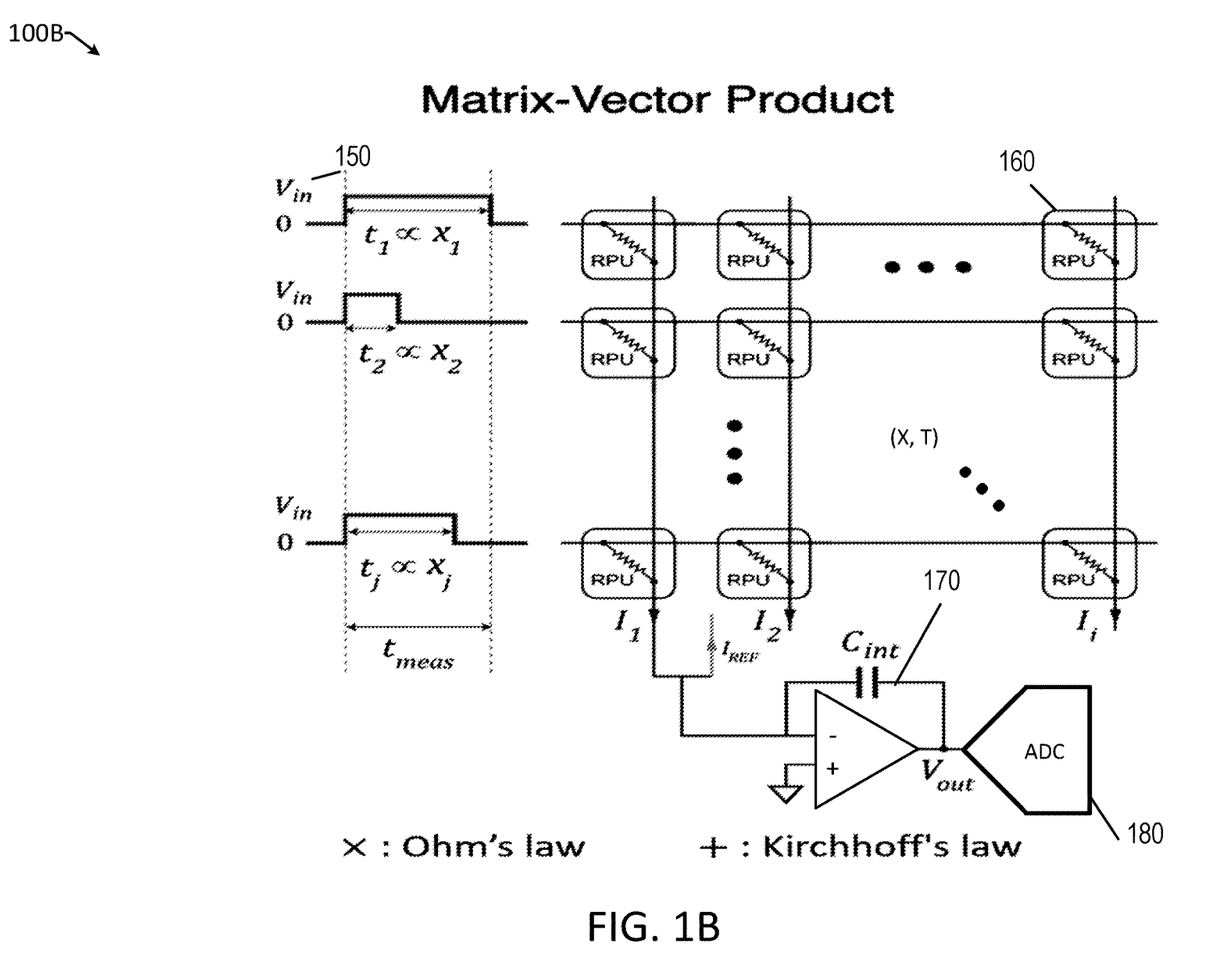

FIGS. 1A and 1B illustrate an outer product and a matrix product of an analog crossbar hardware unit, respectively, consistent with an illustrative embodiment. It is to be understood that the drawings are provided for illustrative purposes, and the present disclosure is not limited to the illustration shown and described.

The analog crossbar hardware unit 100A is configured to perform an outer product function, consistent with an illustrative embodiment. The outer product of two coordinate vectors provides a matrix in linear algebra. The analog crossbar unit is arranged to receive an input voltage in the form of pulses 110. The crossbars have a plurality of memristor elements configured in a matrix. The memristor elements shown are resistor processing unit (RPU) switches 120. Each of the RPU switches represents a respective value of the matrix. The outputs (stochastic pulses 130) are shown along the output portion of the analog crossbar unit 100A.

FIG. 1B illustrates an analog crossbar hardware unit 100B configured to perform a matrix-vector product, consistent with an illustrative embodiment. The number of columns and the number of rows in the matrix-vector product match. Input voltages 150 are provided to the crossbars. The resistor of each of the RPUs 160 outputs a current of a particular value. It is shown in this illustrative embodiment that an amplifier 170 is driven by the current $I_1$, and an analog output voltage is output to an analog-to-digital converter 180. The matrix can be configured in an inverse Hessian or Hessian matrix. Each of the values of the matrix is represented by an RPU, so that quadratic (e.g., $n^2$) complexity operations are performed by the analog crossbar hardware, whereas linear complex operations are performed by a CPU (shown in FIG. 2). This approach increases the speed of the optimization function, but does so at reduced cost by utilizing the CPU 220 (FIG. 2) to perform the linear complexity operations.

Figure 2:
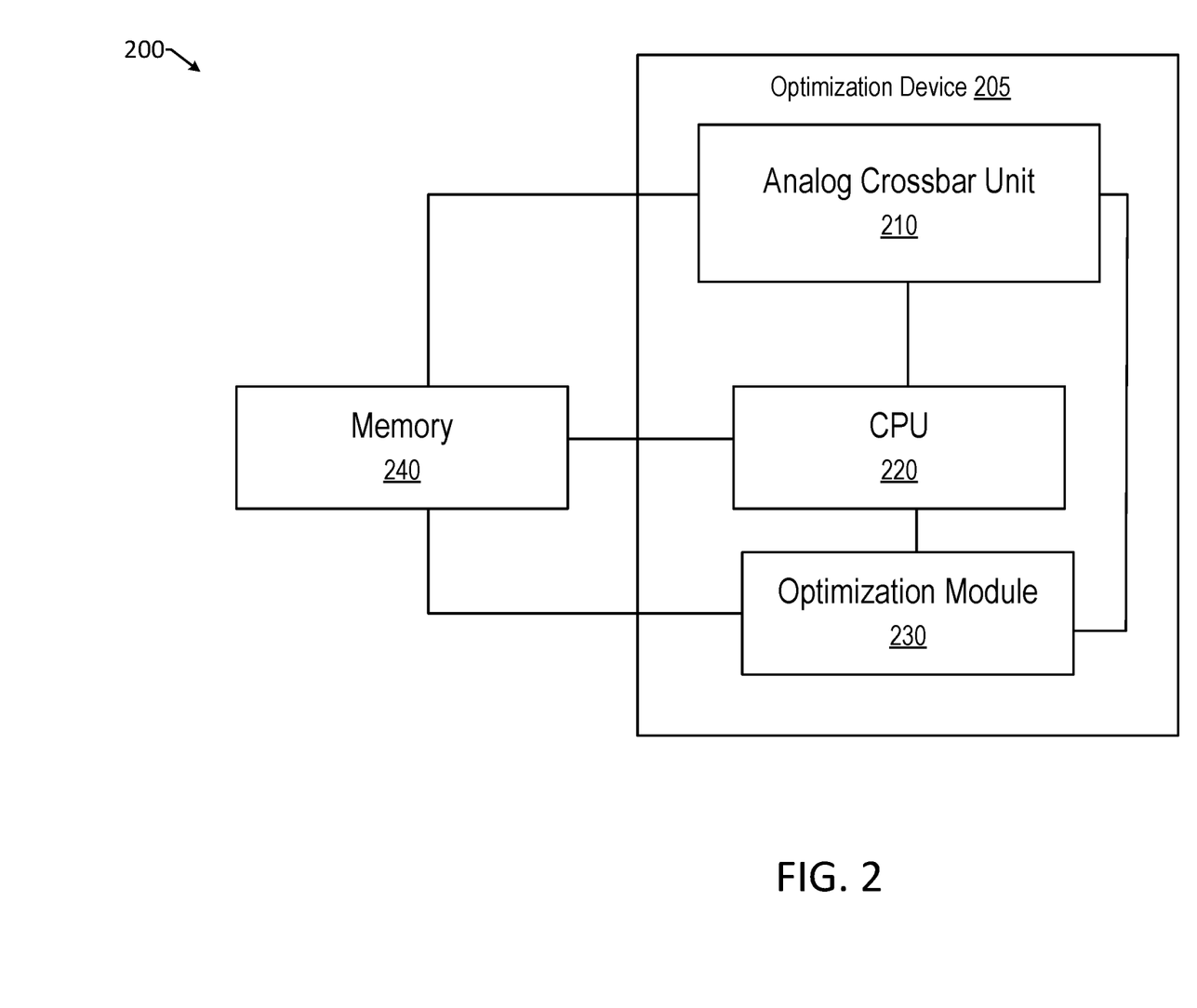
FIG. 2 is an illustration of a convex optimization device, consistent with an illustrative embodiment.

FIG. 2 is an illustration 200 of a convex optimization device 205, consistent with an illustrative embodiment. The optimization device 205 can be coupled to a memory 205 that is configured to provide and store updated data. An analog crossbar hardware unit 210 configured similar to the analog crossbar hardware 100b shown in FIG. 1B can be used. The analog crossbar unit can be configured in a matrix, such as an inverse Hessian matrix, and the analog crossbar hardware can perform the quadratic complexity operations by inputting voltages of predetermined values to the respective RPUs (such as shown in FIG. 1B).

With continued reference to FIG. 2, a CPU 220 is configured to perform the linear complexity operations, to reduce the costs of memory and size of the optimization device 205. The quadratic complexity operations typically take longer to execute than linear complexity operations. Accordingly, the faster analog crossbar hardware, such as the analog crossbar unit 210 and the CPU, provides a type of hybrid design, with each performing some of the functions to achieve convex optimization.

In one embodiment, an optimization module, which can include machine-readable code executed by the CPU 220, or by a controller/processor of the optimization module, is configured to identify the data associated with linear complexity operations to be executed by the CPU 220, and quadratic complexity operations to be executed by the analog crossbar hardware unit 210.

As previously noted, the device and methods of the present disclosure provide an improvement in computer operation, and an improvement in convex optimizations. Such convex optimizations have practical applications in a variety of fields, including but in no way limited to, deep neural networks, robotics, digital signal processing, network analysis, and scientific computing. The faster processing speed provides an increased efficiency in operation with a savings in time and power.

Example Processes

Figure 3:
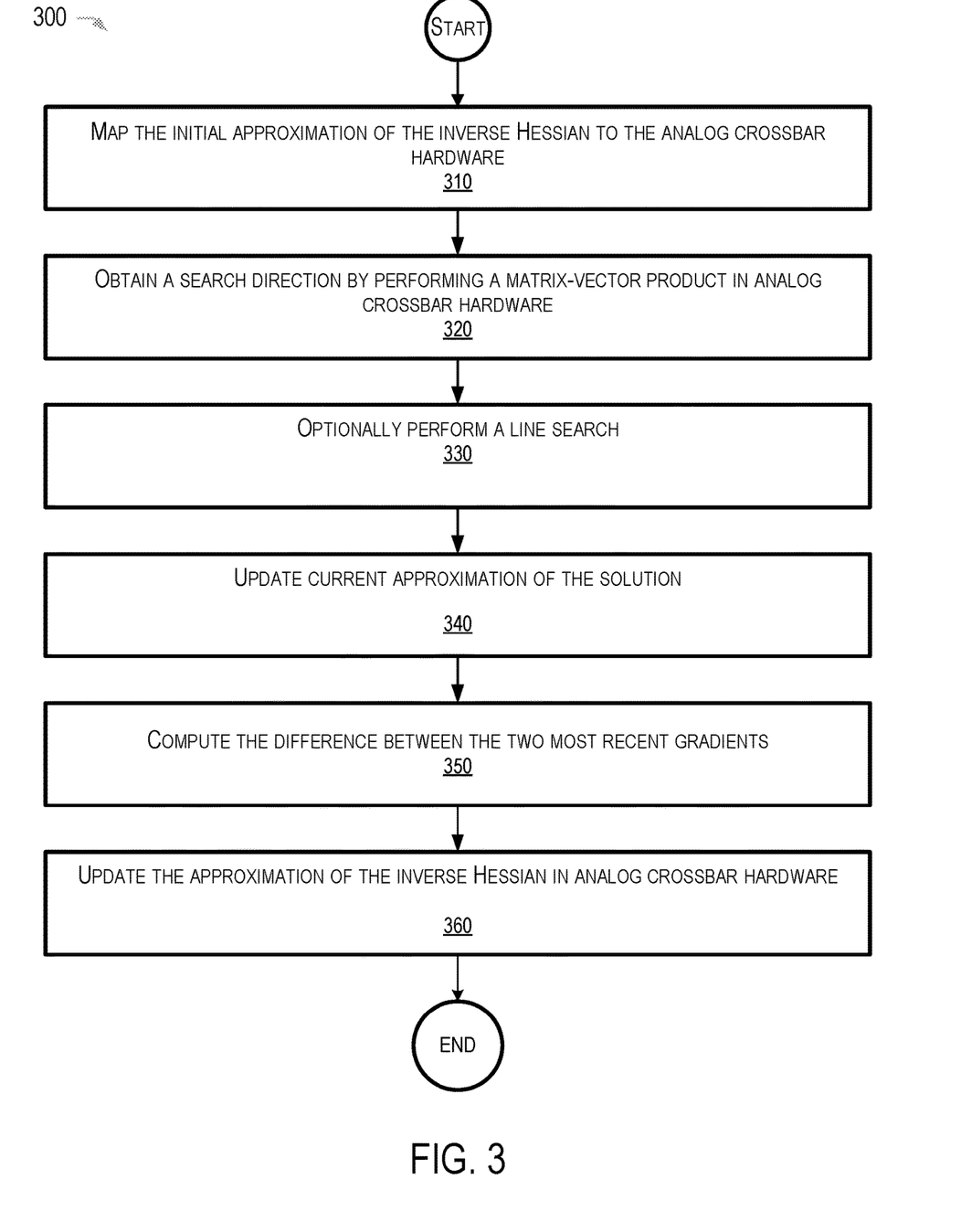
FIG. 3 is a flowchart illustrating a decision hierarchy of a Quasi-Newton process, consistent with an illustrative embodiment.
Figure 4:
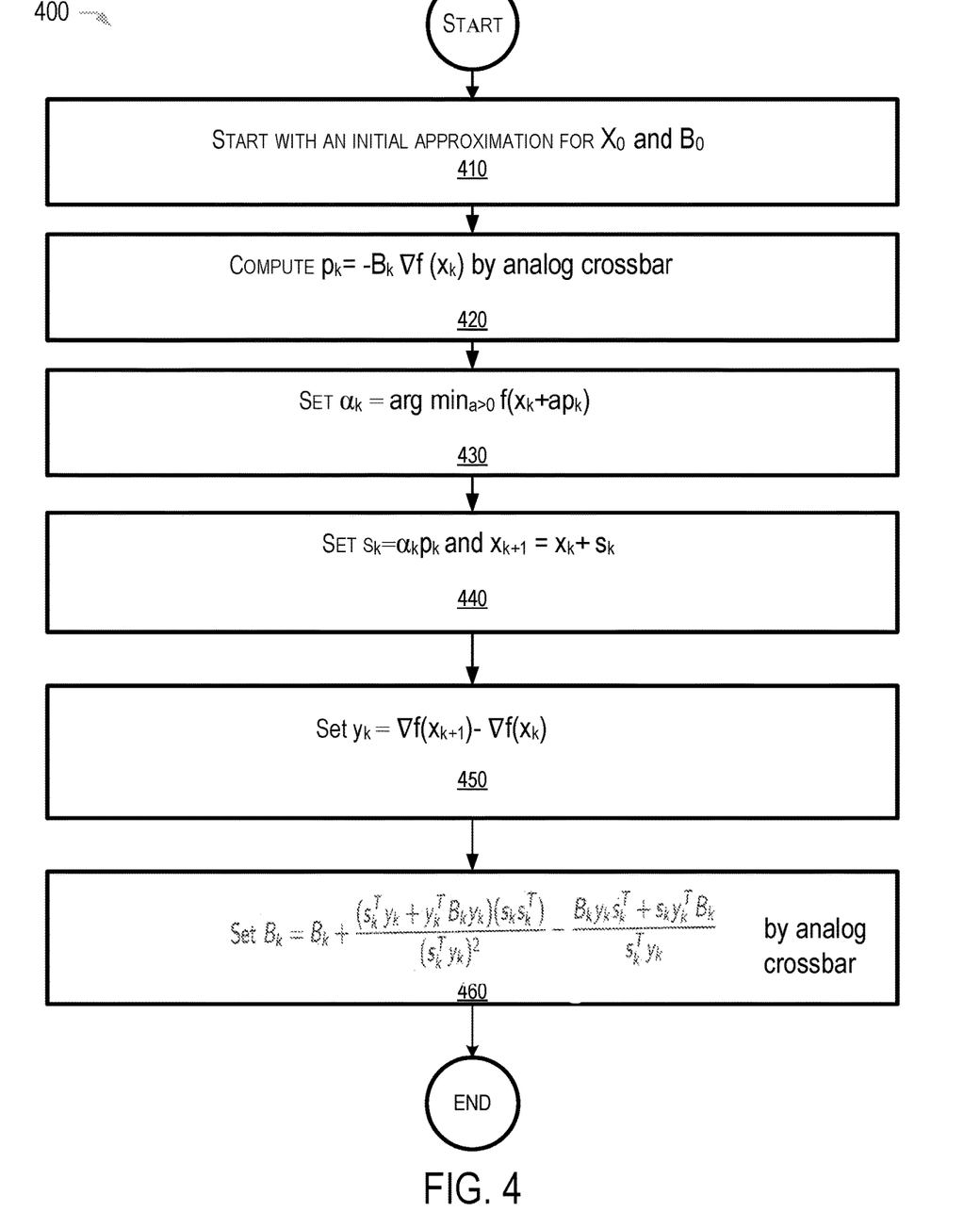
FIG. 4 is a flowchart illustrating operation of a Broyden-Fletcher-Goldfarb-Shanno (BFGS) algorithm, consistent with an illustrative embodiment.
Figure 5:
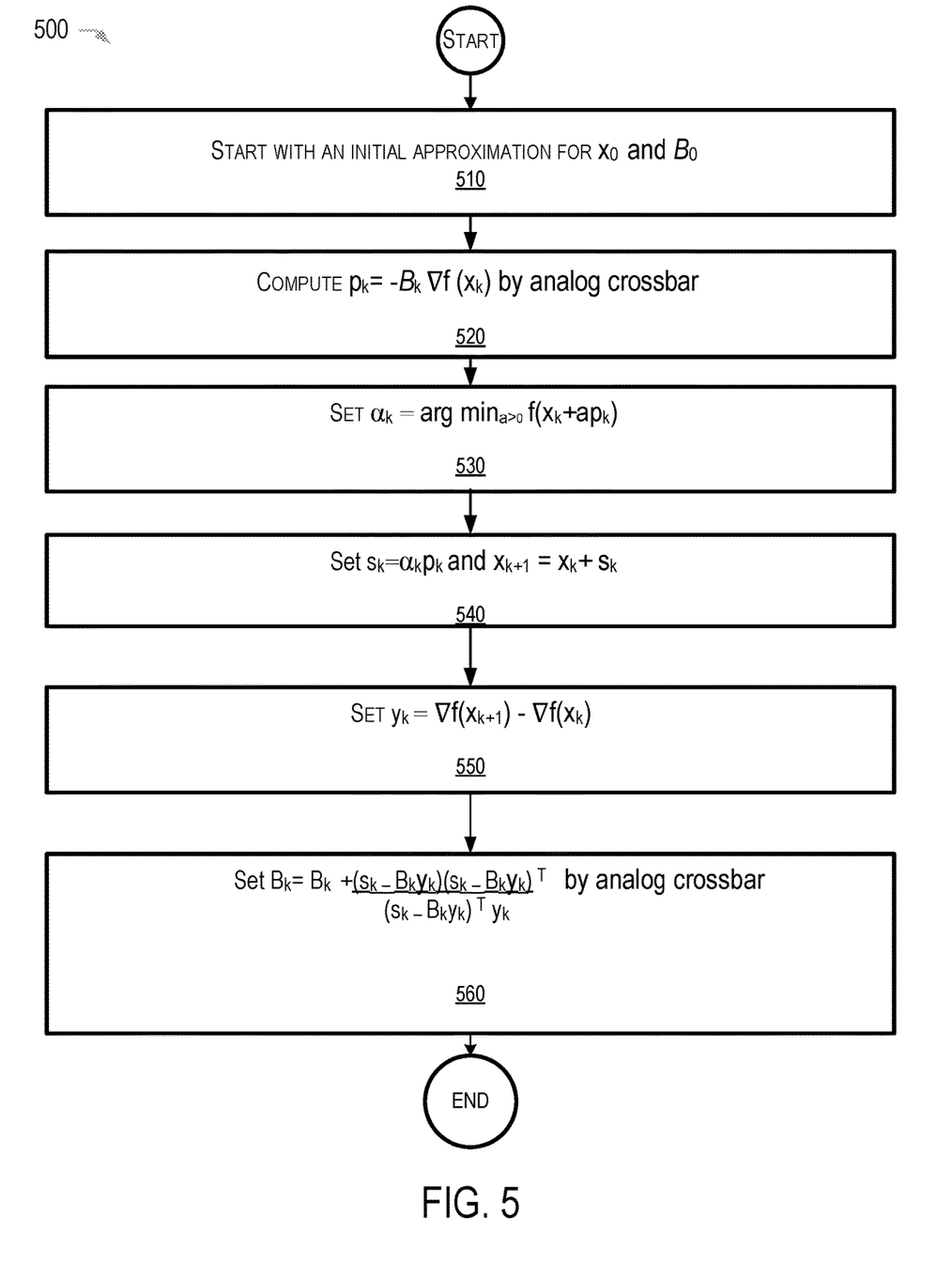
FIG. 5 is a flowchart illustrating operation of a symmetric rank-one (SR1) algorithm, consistent with an illustrative embodiment.

With the foregoing overview of the example architecture, it may be helpful now to consider a high-level discussion of an example process. To that end, FIGS. 3, 4, and 5 are respective flowcharts 300, 400, and 500 of a convex optimization process of the structure shown in FIGS. 1 and 2. It is to be understood that the order of the operations of the flowcharts of FIGS. 3, 4, and 5 are provided for illustrative purposes, and the operations can be performed in a different order than shown in FIGS. 3, 4 and 5.

FIG. 3 is a flowchart illustrating a decision hierarchy of a Quasi-Newton process, consistent with an illustrative embodiment. At operation 310, the initial approximation of the inverse Hessian is mapped to the analog crossbar hardware. A crossbar hardware unit may be configured similar to the configuration in FIG. 1B. An inverse Hessian matrix (or a Hessian matrix) can be configured with initial data values that may be stored or provided. Voltages can be input to the crossbars, and each RPU 160 (see FIG. 1) has an ohmic value and can be used to store an initial value of a point on the matrix. As shown in FIG. 1B, each RPU outputs a value of current that can be used to drive an amplifier that is coupled to an input of an analog-to-digital converter (ADC) 180. The ADC 180 outputs a digital voltage value.

At operation 320, a search direction is obtained by performing a matrix-vector product in analog crossbar hardware. FIG. 1B shows an example of a matrix-vector product. It is to be understood that the analog crossbar arrangement is not limited to the embodiments shown and described herein.

At operation 330, an optional line search is performed by the CPU. The line search is an interactive approach that is performed to find a local minimum of a function. A line search can be used to find a descent direction along which a function is reduced to the minimum, and includes computing an operation to determine how much movement should be made in a direction. There are other methods that can be used to perform a line search other than a Quasi-Newton method. For example, a gradient descent is another method that can be used to perform the line search. The gradient descent method reduces a prediction error. The gradient descent method can be used in machine learning to adjust input weights of a training set.

At operation 340, the current approximation of the solution is updated by the CPU. This update may be based on a line search, or other parameter selection methods (e.g., fixed or adaptive step). Alternatively, the search direction obtained in operation 320 can be used.

At operation 350, a difference between two of the most recent gradients can be computed by the CPU. A gradient points in a direction for function maximization, whereas a gradient descent can be used for function minimization.

At operation 360, the analog crossbar hardware is updated. More particularly, the approximation of the inverse Hessian in the analog crossbar is updated. There is an increased speed in computing with reduced costs by using the analog crossbar hardware for some operation and the CPU for other operations, as compared with, for example, using the CPU for all of the operations.

FIG. 4 is a flowchart illustrating operation of a Broyden-Fletcher-Goldfarb-Shanno (BFGS) algorithm of the Quasi-Newton family of methods, consistent with an illustrative embodiment. In this illustrative embodiment, a BFGS algorithm is used to illustrate that by performing some of the operations on analog crossbar hardware, an increase in speed and efficiency can be obtained. In particular, operations 420 and 460 are performed by the analog crossbar hardware, and operations 410, 430, 440, and 450 are performed by the CPU.

Thus, an exhaustive explanation of the BFGS algorithm is not necessary for purposes of this disclosure; rather, the purpose is to show that certain steps can be performed on the analog crossbar hardware.

The BFGS algorithm starts at operation 410 with an initial approximation for $X_o$ and $B_o$. It should be noted that $B_o$ is an approximation to the Hessian matrix, and "$\nabla f(x_k)$" is the gradient of the function evaluated at $x_k$.

At operation 420, a line search in the search direction $p_k$ is performed by the analog crossbar hardware to find the next point $x_{k+1}$.

At operation 430, a stepsize of the line search is set. At operation 440, there is an update of $x_{k+1}=x_k+s_k$, and at operation 450 a secant $Y_k$ is set. At operation 460, the update equation of fully set. Operation 460 is performed on the analog crossbar hardware.

FIG. 5 is a flowchart illustrating an operation of a symmetric rank-one (SR1) process by the Quasi-Newton method, consistent with an illustrative embodiment. Similar to the explanation in FIG. 4, the SR1 process is provided to show that two operations (i.e., the computing of the line search direction at operation 520, and the setting of the update equation 560) are performed on the analog crossbar hardware. The other operations 510, 530, 540, and 550 are performed by the CPU. It should be noted that the operations 510, 520, 520, 530, 540, and 550 are substantially similar to the operations in FIG. 4, so a redundant explanation is omitted. The equation set at operation 560 is different than equation 460. However, as previously indicated, this process is being illustrated to show that the analog crossbar hardware performs some of the operations, whereas the remainder of the operations are performed by the CPU. However, it should be understood that the present disclosure is not limited to the operations shown in the flowcharts. For example, more or fewer than two operations shown in each of FIGS. 4 and 5 may be performed on the analog crossbar hardware.

Figure 6:
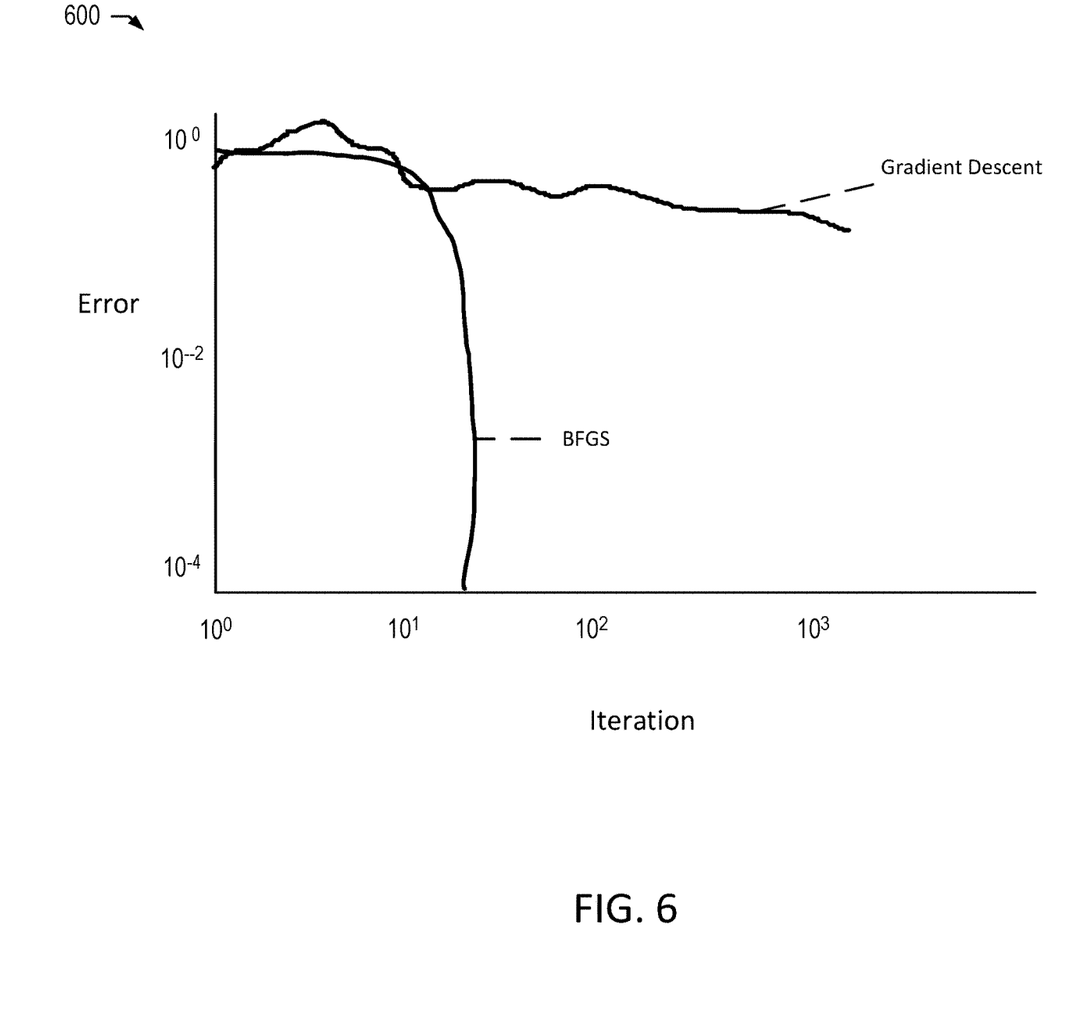
FIG. 6 is a graph showing the results of a Rosenbrock test function of a BFGS algorithm, versus a Gradient Descent, consistent with an illustrative embodiment.

FIG. 6 is a graph 600 showing the results of a Rosenbrock test function of a BFGS algorithm, versus a Gradient Descent, consistent with an illustrative embodiment. A Rosenbrock function is a non-convex function that is used for performance testing of optimization algorithms. FIG. 6 shows a graph of the gradient descent versus BFGS, when executed by the process and device according to the present disclosure. The Y-axis is the error rate, and the X-axis is the iteration count. It can be seen from FIG. 6 that BFGS, particularly when performed by the use of the analog crossbar hardware according to the present disclosure, shows that a very small error rate is reached with far fewer iterations than via Gradient Descent.

Figure 7:
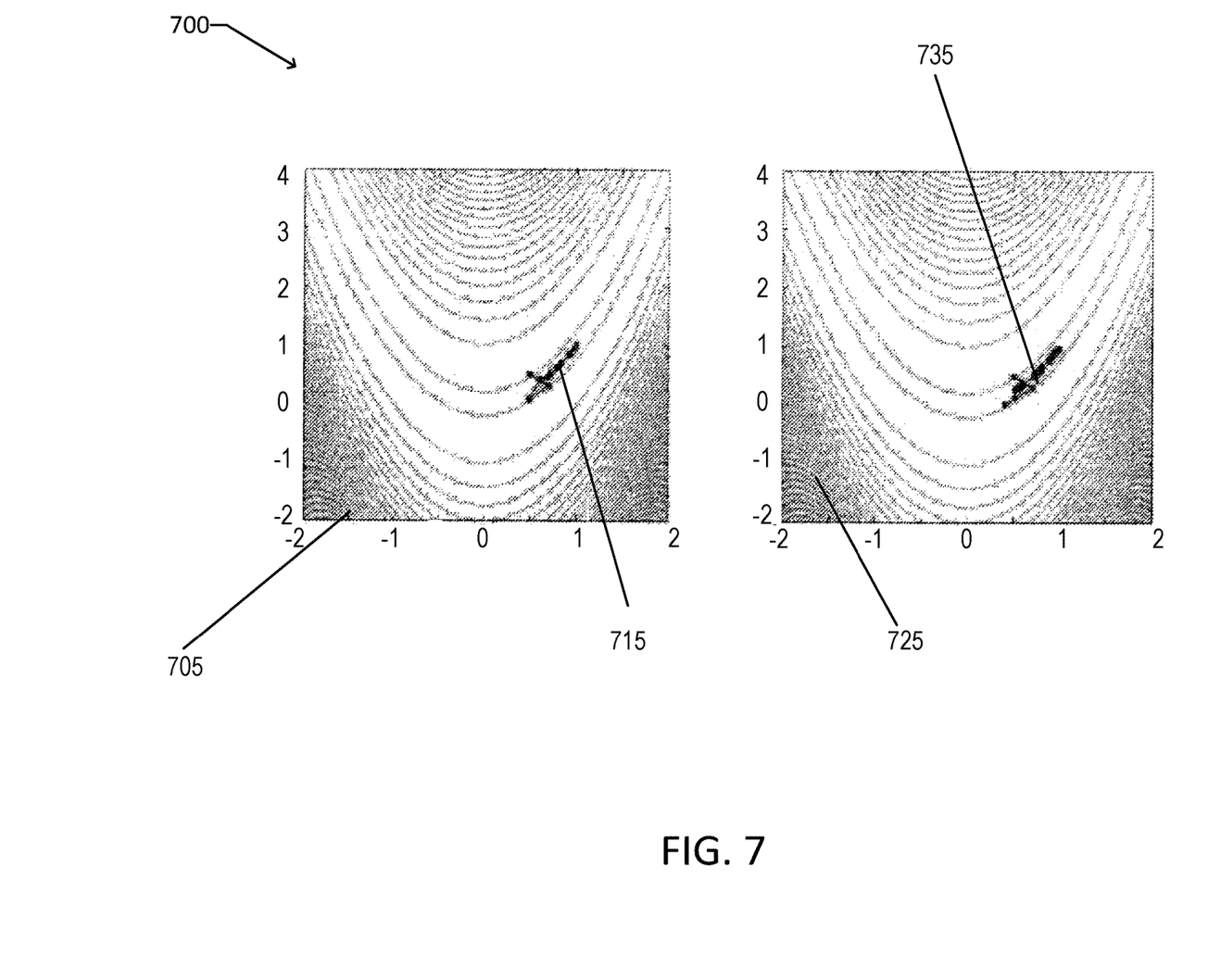
FIG. 7 shows graphs of the Rosenbrock test function of the BFGS algorithm at different iterations, consistent with an illustrative embodiment.

FIG. 7 shows graphs of the Rosenbrock test function 700 of the BFGS algorithm at different iterations, consistent with an illustrative embodiment. Graph 705 shows 27 iterations and graph 725 shows 305 iterations.

Figure 8:
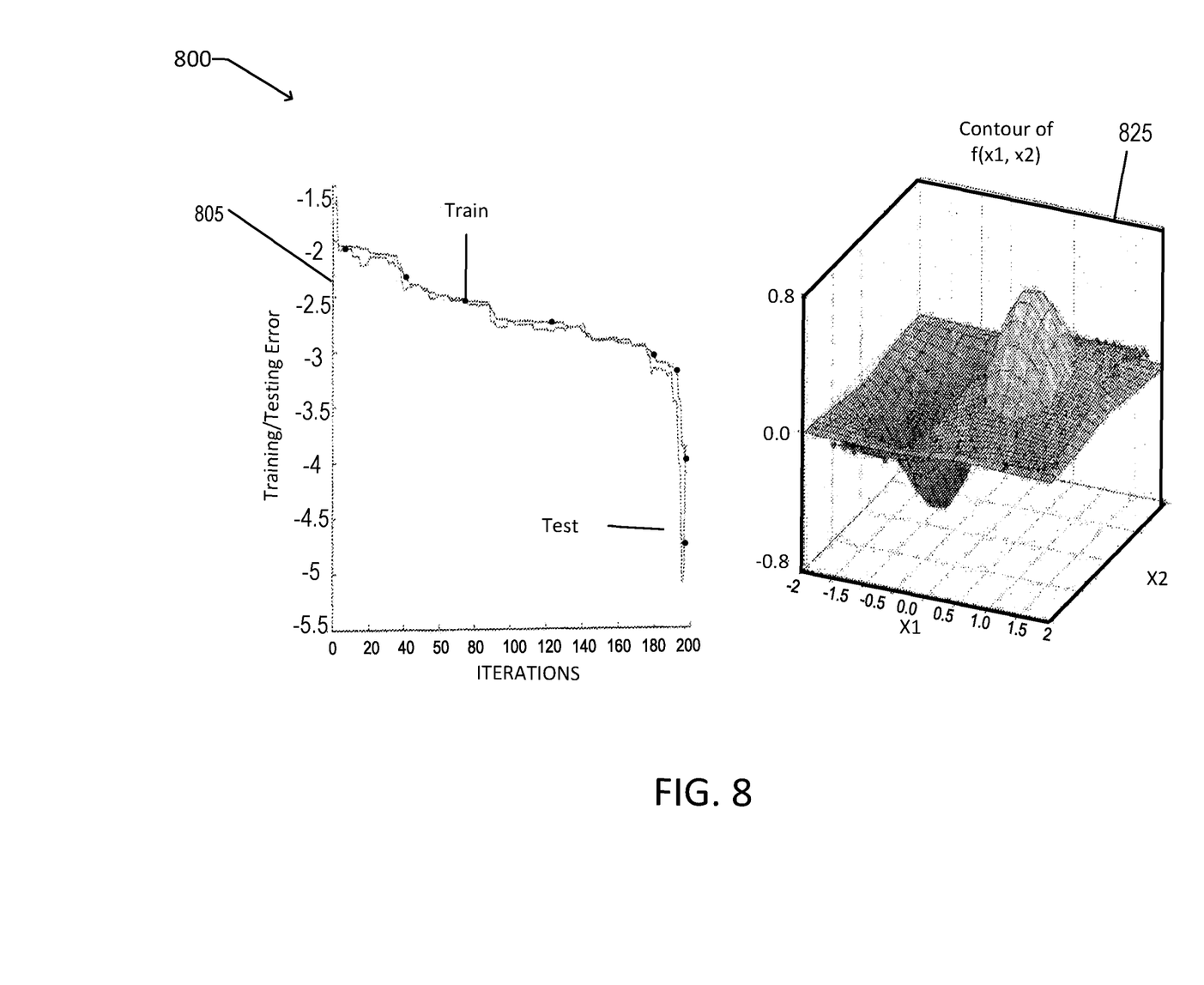
FIG. 8 illustrates an approximation of a function with a 2-layer feed-forward neural network using a BFGS optimizer, consistent with an illustrative embodiment.

FIG. 8 illustrates an approximation of a function with a 2-layer feed-forward neural network using a BFGS optimizer, consistent with an illustrative embodiment. Graph 805 shows iterations in the X-axis, versus training/testing errors in the Y direction, and graph 825 shows a contour of f(x1, x2). In the example of FIG. 8, BFGS was used as the optimizer. In 805 the test data has a pronounced slope at the 200 iteration mark that is greater than the train data. FIG. 8 demonstrates the possibility to use analog-digital hybrid BFGS schemes for the training of neural networks.

Figure 9:
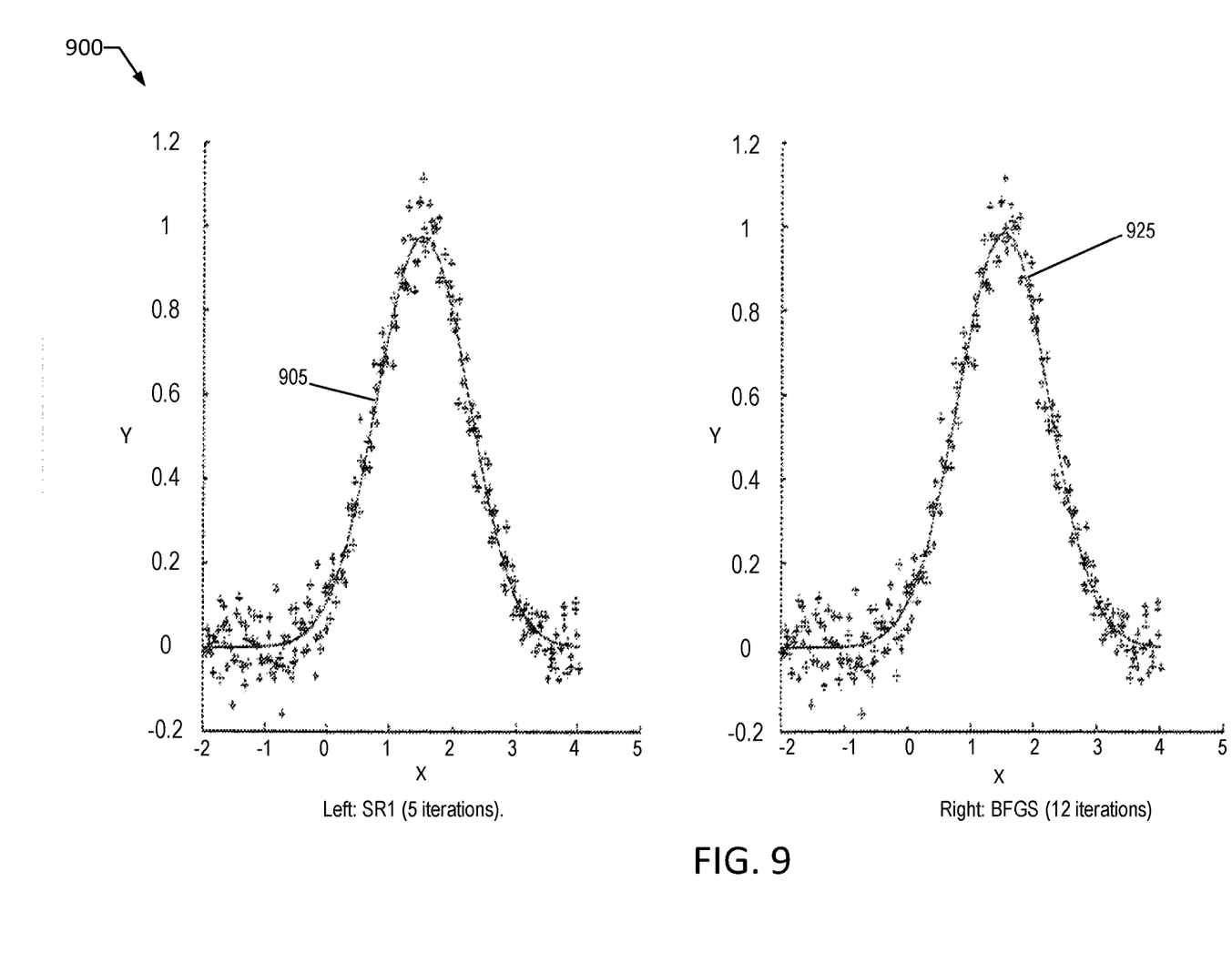
FIG. 9 illustrates a Gaussian distribution utilizing an SR1 versus a BFGS algorithm, consistent with an illustrative embodiment.

FIG. 9 illustrates a Gaussian distribution utilizing an SR1 versus a BFGS algorithm, consistent with an illustrative embodiment. The left graph 905 used an SR1 algorithm according to the process of the present disclosure, and the right graph 925 used BFGS. It can be seen that both hybrid approaches provide meaningful results regardless of the additional noise introduced by the analog crossbar hardware.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A computer implemented method for speeding up execution of a convex optimization operation, the method comprising:
    identifying one or more quadratic complexity operations to be performed by an analog crossbar hardware unit;
    identifying one or more linear complexity operations to be performed by a CPU;
    performing at least one of the quadratic complexity operations;
    performing at least one of the linear complexity operations; and
    updating an iteration of an approximation of a solution to the convex optimization algorithm by the CPU.

2. The method according to claim 1, further comprising computing, by the CPU, a difference between two most recent gradients of the approximation of the solution to the convex optimization operation.

3. The method according to claim 1, wherein the performing the at least one of the quadratic complexity operation includes mapping an initial approximation of a Hessian matrix or an inverse Hessian matrix to the analog crossbar hardware unit.

4. The method according to claim 3, further comprising updating the initial approximation of the Hessian matrix or the inverse Hessian matrix in the analog crossbar hardware unit.

5. The method according to claim 4, wherein the convex optimization operation comprises a Quasi-Newton algorithm, and the method further comprises configuring a plurality of analog crossbars elements of the analog crossbar hardware unit into a matrix to perform the one or more quadratic complexity operations of the Quasi-Newton algorithm.

6. The method according to claim 5, wherein the performing the at least one quadratic complexity operation includes obtaining a search direction by performing a matrix-vector product in the analog crossbar hardware elements.

7. The method according to claim 5, wherein the Quasi-Newton algorithm comprises a training algorithm for a Deep Neural Network.

8. The method according to claim 1, further comprising performing a line search by the CPU.

9. A convex optimization device comprising:
an analog crossbar hardware unit comprising a plurality of memristor elements configured in a matrix to perform one or more quadratic complexity operations;
a CPU configured to perform one or more linear complexity operations; and
a memory configured to store an input and receive an output from the analog crossbar hardware unit and to store an output of the linear complexity operation executed by the CPU.

10. The device according to claim 9, further comprising an identifier module configured to identify one or more quadratic complexity operations to be performed by the analog crossbar hardware unit, and to identify the one or more linear complexity operations to be performed by the CPU.

11. The device according to claim 10, wherein the plurality of memristor elements comprise one or more resistor processing unit (RPU) switches.

12. The device according to claim 11, wherein each of the RPU switches represents a value of the matrix, respectively.

13. The device according to claim 12, wherein:
the matrix of the plurality of memristor elements includes a voltage input and a voltage output to each respective RPU switch; and
an output of each respective RPU switch comprises a current having a particular value.

14. The device according to claim 9, wherein:
the matrix of the plurality of memristor elements of the analog crossbar hardware is configured to one of a Hessian matrix or an inverse Hessian matrix configured to perform quadratic complexity operations of a Quasi-Newton algorithm; and
the CPU is configured to perform linear complexity operations of the Quasi-Newton algorithm.

15. The device according to claim 14, wherein an initial approximation of one of the Hessian matrix or the inverse Hessian matrix is mapped to the analog hardware crossbar unit.

16. A computer implemented accelerated Quasi-Newton method of convex optimization, the method comprising:
configuring a plurality of memristor elements of an analog crossbar hardware unit in a matrix to perform one or more quadratic complexity operations;
executing one or more linear complexity operations of the algorithm by a CPU;
storing an input and receiving an output of data from the analog crossbar hardware unit; and
storing an output of the linear complexity operation executed by the CPU.

17. The computer implemented Quasi-Newton method according to claim 16, further comprising:
identifying one or more quadratic complexity operations to be performed by the analog crossbar hardware unit; and
identifying one or more linear complexity operations to be executed by the CPU.

18. The computer implemented Quasi-Newton method according to claim 16, wherein the plurality of memristor elements are configured in one of a Hessian matrix or an inverse Hessian matrix to perform the quadratic complexity operations.

19. The computer implemented Quasi-Newton method according to claim 16, further comprising mapping one of an initial Hessian matrix or an initial inverse Hessian matrix to the analog hardware crossbar unit.

20. The computer implemented Quasi-Newton method according to claim 19, further comprising updating an initial approximation of the Hessian matrix or an initial approximation of the inverse Hessian matrix in the analog crossbar hardware unit.

* * * * *